(12) United States Patent
Watanabe et al.

(10) Patent No.: US 7,969,019 B2
(45) Date of Patent: Jun. 28, 2011

(54) MODULE WITH STACKED SEMICONDUCTOR DEVICES

(75) Inventors: Mitsuhisa Watanabe, Tokyo (JP); Ichiro Anjoh, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 95 days.

(21) Appl. No.: 12/349,809

(22) Filed: Jan. 7, 2009

(65) Prior Publication Data
US 2009/0184430 A1 Jul. 23, 2009

(30) Foreign Application Priority Data
Jan. 21, 2008 (JP) ................. 2008-010513

(51) Int. Cl.
*H01L 23/48* (2006.01)
(52) U.S. Cl. ............... 257/777; 257/686; 257/E25.006; 438/109
(58) Field of Classification Search .................... 257/777
See application file for complete search history.

(56) References Cited

U.S. PATENT DOCUMENTS
2003/0148598 A1* 8/2003 Tu et al. ................... 438/612
2004/0113253 A1* 6/2004 Karnezos ................. 257/686
2007/0075435 A1* 4/2007 Suminoe et al. ............ 257/777
2007/0241463 A1* 10/2007 Yamaguchi et al. ......... 257/777

FOREIGN PATENT DOCUMENTS
JP 9-260536 10/1997
JP 2001-085609 3/2001

* cited by examiner

*Primary Examiner* — Ajay K Arora
(74) *Attorney, Agent, or Firm* — Young & Thompson

(57) ABSTRACT

Semiconductor device 1 includes: first wiring board 5 provided with a plurality of external terminals 9 on the under surface thereof; first semiconductor chip 3 with the under surface thereof mounted on the upper surface of first wiring board 5; and second semiconductor chip 10 with the under surface thereof mounted on the upper surface of first semiconductor chip 3. On the upper surface of first wiring board 5, connecting pad 6a and connecting pad 6b are provided, while connecting pad 6a is electrically connected with the under surface of first semiconductor chip 3 and connecting pad 6b is arranged closely to an end portion of first semiconductor chip 3. Connecting pad 6a and connecting pad 6b are electrically connected with external terminals 9. Semiconductor device 1 further includes: connecting pad 6c provided as contacting or as being close to an upper end portion of second semiconductor chip 10 while being electrically connected with the upper surface of second semiconductor chip 10, and wire 12 which electrically connects connecting pad 6b and connecting pad 6c.

8 Claims, 11 Drawing Sheets

MODULE WITH STACKED SEMICONDUCTOR DEVICES

This application is based upon and claims the benefit of priority from Japanese patent application No. 2008-010513, filed on Jan. 21, 2008, the disclosure of which is incorporated herein in its entirety by reference.

BACKGROUND OF THE INVENTION

1. Field of the Invention

The present invention relates to a semiconductor device and a semiconductor module including semiconductor devices.

2. Description of the Related Art

In recent years, the issue of miniaturizing and realizing higher performance with respect to a semiconductor device has come to be considered a great deal.

Japanese Patent Laid-Open No. 09-260536 discloses a semiconductor device in which miniaturization is attempted. In this semiconductor device, a flexible wiring board has openings formed in the center, and external terminals are provided at the under surface of the flexible wiring board while a semiconductor chip is attached to the upper surface of the flexible wiring board. The wiring board and electrodes provided in a central portion of the under surface of the semiconductor chip are electrically connected through wires which are passed through the openings of the wiring board. An elastomer, being an elastic member, is provided in between the semiconductor chip and the wiring board. The openings of the wiring board, inside which the electrodes of the semiconductor chip and the wires are arranged, are covered with a sealing body formed by an insulating resin.

Japanese Patent Laid-Open No. 2001-85609 discloses a semiconductor device which is arranged to include two laminated semiconductor chips for realizing higher performance. In this semiconductor device, a flexible wiring board has openings formed in the center, and external terminals are provided at the under surface of the flexible wiring board, while a first semiconductor chip is attached to the upper surface of the flexible wiring board and a second semiconductor chip is mounted on the upper surface of the first semiconductor chip. The wiring board and electrodes provided in a central portion of the under surface of the first semiconductor chip are electrically connected through wires which are passed through the openings of the wiring board. Moreover, the wiring board and electrodes provided in a central portion of the upper surface of the second semiconductor chip are electrically connected through wires which are passed outside the semiconductor chips. An elastomer, being an elastic member, is provided in between the first semiconductor chip and the wiring board. The openings of the wiring board, inside which the electrodes of the first semiconductor chip and the wires are arranged, are covered with a sealing body formed by an insulating resin.

With respect to a semiconductor device, electric resistance in wiring can be reduced by shortening the wires. Thereby, the semiconductor device will be able to achieve improved electric characteristic, as a result of which noise can be reduced and operation speed can be made faster.

With respect to the semiconductor device disclosed in Japanese Patent Laid-Open No. 09-260536, the openings of the wiring board are there in the vicinities of the positions where the electrodes of the semiconductor chip are arranged, and therefore, it is necessary that the wires are at least long enough to connect between the electrodes of the semiconductor chip and the wiring board. Therefore, with this semiconductor device, it is not possible to make the wires any shorter than the required length. Accordingly, with this semiconductor device, it is difficult to achieve improved electric characteristics.

Likewise, with respect to the semiconductor device disclosed in Japanese Patent Laid-Open No. 2001-85609, since the openings of the wiring board are there in the vicinities of the positions where the electrodes of the first semiconductor chip are arranged, it is not possible to make the wires any shorter than the length that needs to be long enough to make a connection between the electrodes of the first semiconductor chip and the wiring board. Accordingly, with this semiconductor device, it is difficult to achieve improved electric characteristics.

Furthermore, with respect to the semiconductor device disclosed in Japanese Patent Laid-Open No. 2001-85609, since the electrodes of the second semiconductor chip are positioned in the central portion of the upper surface of the second semiconductor chip, the electrodes need to be connected with the wiring board through wires passed outside the semiconductor chips so that they can be electrically connected with the wiring board. Therefore, with this semiconductor device, long wires are required to be used, as a result of which the electric characteristics will be deteriorated.

Moreover, in either of the semiconductor devices disclosed in Japanese Patent Laid-Open No. 09-260536 and Japanese Patent Laid-Open No. 2001-85609, the wiring board or the first wiring board has openings where the external terminals cannot be arranged. Accordingly, the areas in the wiring board where the external terminals can be arranged will be limited by the areas of the openings formed in the wiring board. Therefore, it is probable that the semiconductor device will not have a sufficient number of external terminals to accomplish necessary functions.

In addition, when the wires connecting the second semiconductor chip and the wiring board are long as in the case of the semiconductor device disclosed in Japanese Patent Laid-Open No. 2001-85609, it is possible that the wires may contact one another or contact end portions of the semiconductor chips, causing failure in the semiconductor device. In order to prevent the wires from contacting the semiconductor chips, widely separating the connecting positions of wires on the wiring board from the end portions of the semiconductor chips is a possible measure. In this case, however, it is necessary to use a large wiring board, which will cause the semiconductor device to become larger in size. Accordingly, from that point of view as well, it is still preferable that the wires of the semiconductor device be shorter.

Furthermore, with respect to the semiconductor device disclosed in Japanese Patent Laid-Open No. 2001-85609, the openings of the wiring board, inside which the electrodes of the first semiconductor chip and the wires are arranged, are covered with a sealing body formed by an insulating resin. The wires are passed from the electrodes of the semiconductor chip through the openings of the wiring board to connect with the under surface of the wiring board, and the portions of the wires sticking out underneath the under surface of the wiring board are also covered with the sealing body. Thus, the sealing body bulges out downwardly from the under surface of the wiring board. Therefore, when the height of the external terminals are shorter than the height of the bulging sealing body, there may be cases where the sealing body will become an obstacle in a secondary mounting of the semiconductor device. Accordingly, with this semiconductor device, it is necessary to form the external terminals such that they are higher than the height of the sealing body. The external terminals are solder balls which are approximately spherical in shape. Therefore, if the height of the external terminals is made higher, then the diameter of the external terminals with respect to the side of the wiring board will also increase, which makes it difficult to position external terminals in a high density arrangement.

Moreover, in the semiconductor device with respect to either of the cases, an elastomer is arranged in between the semiconductor chip and the wiring board, in order to reduce the stress caused by the difference in the thermal expansion rate between the semiconductor chip and the wiring board. With such arrangement, improvement in reliability of the semiconductor device is attempted. An elastomer, however, is an expensive material, and thus, using an elastomer will raise manufacturing costs.

SUMMARY

In one embodiment, there is provided a semiconductor device according to the present invention that includes: a first wiring board provided with a plurality of external terminals on one surface thereof; a first semiconductor chip with one surface thereof being mounted on the other surface of the first wiring board; a second semiconductor chip with one surface thereof being mounted on the other surface of the first semiconductor chip; a first connecting portion provided on the other surface of the first wiring board while being electrically connected with one surface of the first semiconductor chip and with the external terminal; a second connecting portion provided closely to an end portion of the first semiconductor chip while being electrically connected with the external terminal; a third connecting portion provided as contacting or as being close to an end portion of the other surface of the second semiconductor chip while being electrically connected with the other surface of the second semiconductor chip; and a conductive wire which electrically connects the second connecting portion and the third connecting portion.

BRIEF DESCRIPTION OF THE DRAWINGS

The above features and advantages of the present invention will be more apparent from the following description of certain preferred embodiments taken in conjunction with the accompanying drawings in which.

DESCRIPTION OF THE EXEMPLARY EMBODIMENTS

Exemplary embodiments will now be described with reference to the drawings.

First Exemplary Embodiment

Figure 1:
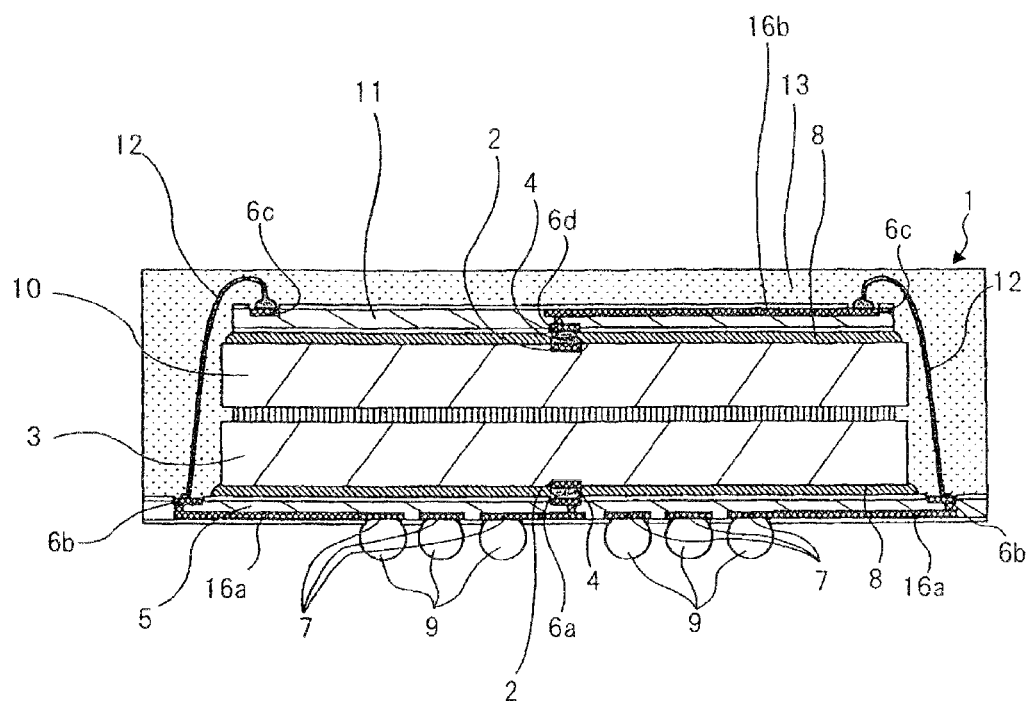
FIG. 1 is a sectional side view of a semiconductor device according to a first exemplary embodiment.
Figure 2:
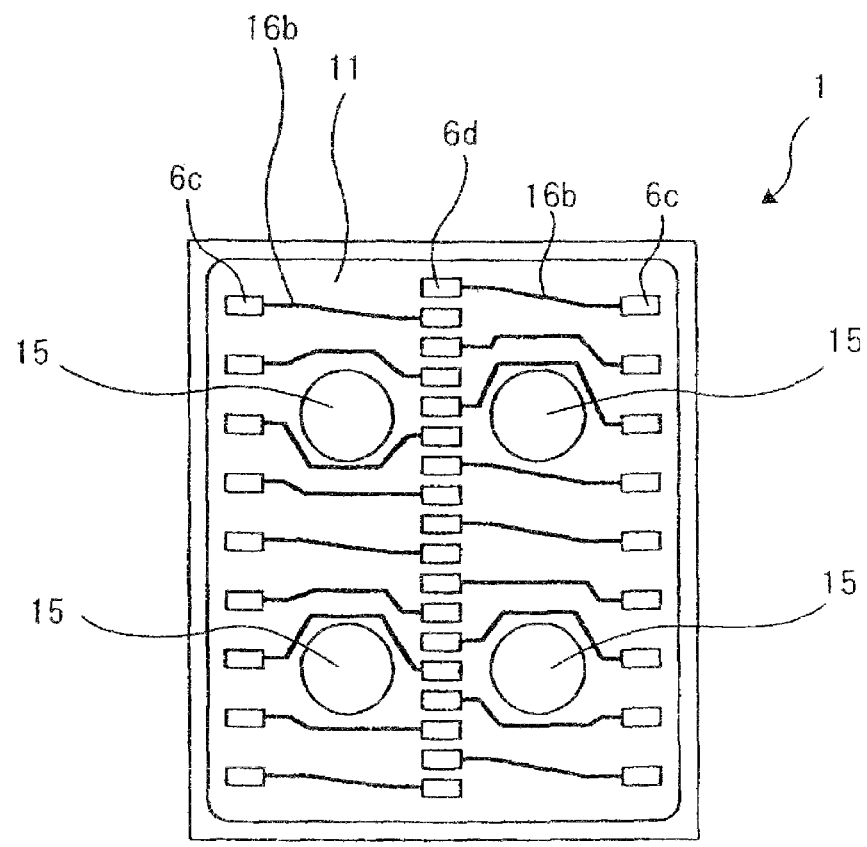
FIG. 2 is a top view of the semiconductor device shown in FIG. 1.
Figure 3:
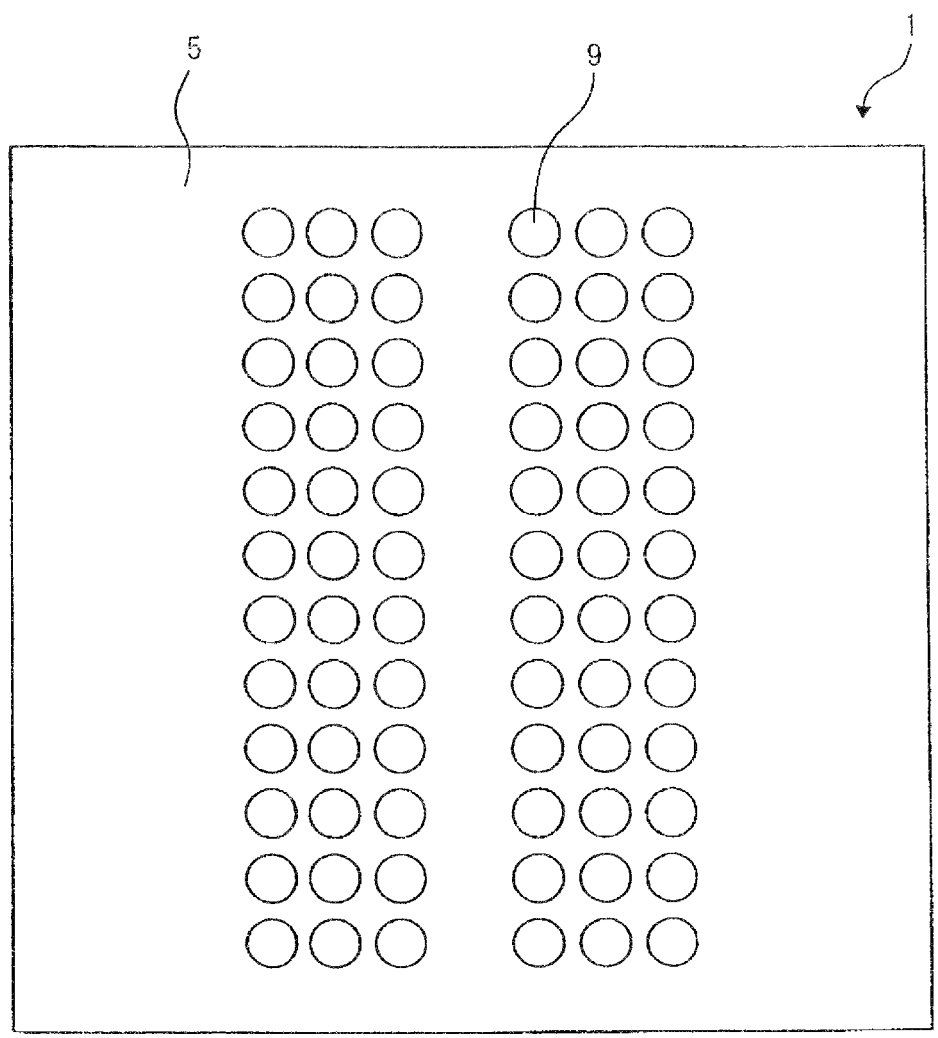
FIG. 3 is a bottom view of the semiconductor device shown in FIG. 1, etc.

FIG. 1 is a sectional side view of a semiconductor device according to a first exemplary embodiment, FIG. 2 is an upper view of the semiconductor device and FIG. 3 is a bottom view of the semiconductor device.

As shown in FIG. 1, semiconductor device 1 according to the present exemplary embodiment includes first wiring board 5, first semiconductor chip 3 mounted on and flip-chip bonded to the upper surface of first wiring board 5, second semiconductor chip 10 mounted on the upper surface of first semiconductor chip 3, and second wiring board 11 mounted on and flip-chip bonded to the upper surface of second semiconductor chip 10. Moreover, semiconductor device 1 includes wires 12 which electrically connect between first wiring board 5 and second wiring board 11, external terminals 9 attached to the under surface of first wiring board 5, and sealing portion 13 covering the upper side of first wiring board 5. First wiring board 5 and second wiring board 11 are made of polyimide resins, and external terminals 9 are made of solders to be approximately spherical in shape.

Electrode pads 2 are provided in central portions of the under surface of first semiconductor chip 3 and the upper surface of second semiconductor chip 10, respectively, while the upper surface of first semiconductor chip 3 and the under surface of second semiconductor chip 10 are attached to each other through a DAF (die attached film). Bump electrodes 4 are formed on respective electrode pads 2 of first semiconductor chip 3 and second semiconductor chip 10.

On the upper surface side of first wiring board 5, connecting pads 6a, which are first connectors, are provided in a central portion, while connecting pads 6b, which are second connecting portions, are provided in both end portions. Lands 7 are provided in a central region of first wiring board 5 on the under surface side, lands 7 being electrically connected with connecting pads 6a and 6b, respectively, through wires 16a.

The under surface of first semiconductor chip 3 and the upper surface of first wiring board 5 are attached to each other through underfill material 8. Electrode pads 2 of first semiconductor chip 3 are electrically connected with connecting pads 6a of first wiring board 5 through bump electrodes 4. Insulating solder resists are formed on both surfaces of first wiring board 5, except for the portions corresponding to connecting pads 6a and 6b, and lands 7.

With respect to second wiring board 11, connecting pads 6c, which are third connectors, are provided in both end portions on the upper side of second wiring board 11, while connecting pads 6d, which are fourth connectors, are provided in a central portion on the lower side of second wiring board 11. The under surface of second wiring board 11 and the upper surface of second semiconductor chip 10 are attached to each other through underfill material 8. Electrode pads 2 of second semiconductor chip 10 are electrically connected with connecting pads 6d of second wiring board 11 through bump electrodes 4. As shown in FIG. 2, connecting pads 6d in the central portion of second wiring board 11 on the under surface side are electrically connected with connecting pads 6c in the end portions of second wiring board 11 on the upper surface side through wires 16b. Connecting pads 6c provided in both end portions of second wiring board 11 on the upper surface side are electrically connected with connecting pads 6b provided in both end portions of first wiring board 5 through wires 12, respectively. Insulating solder resists are formed on both surfaces of second wiring board 11, except for the portions corresponding to connecting pads 6c and 6d.

On the upper side of first wiring board 5, sealing portion 13 is formed in such as way as to cover first semiconductor chip 3, second semiconductor chip 10, wires 12, etc.

Furthermore, as shown in FIG. 3, external terminals 9 provided at lands 7 of first wiring board 5 are arranged in a grid pattern. Each external terminal 9 is formed into an approximately spherical shape of about 0.35 mm in diameter, and external terminals 9 are arranged at 0.5 mm pitches in such a way that they are gathered in the central region of first wiring board 5.

As described above, in semiconductor device 1, electrode pads 2 of first semiconductor chip 3 are linearly and electrically connected with the under surface of first wiring board 5, where external terminals 9 are provided, in a vertical direction, through bump electrodes 4 and connecting pads 6a, without using any wire. Moreover, since external terminals 9 are arranged in such a way that they are gathered in the central region of first wiring board 5 which is near the region directly underneath electrode pads 2, external terminals 9 and electrode pads 2 of first semiconductor chip 3 are electrically connected within a short distance. In this way, since electrode pads 2 of first semiconductor chip 3 and external terminals 9 are electrically connected within a short distance, semiconductor device 1 can achieve excellent electric characteristics.

Furthermore, in semiconductor device 1, since connecting pads 6c of second wiring board 11 are arranged in both end portions of second wiring board 11 on the upper side, connecting pads 6b on both end portions of first wiring board 5 and connecting pads 6c are closely positioned. Therefore, in semiconductor device 1, the lengths of wires 12, which electrically connect between connecting pads 6b of first wiring board 5 and connecting pads 6c of second wiring board 11, are shortened. In this way, semiconductor device 1 is improved in terms of electric characteristics.

Further, by arranging lands 7 of first wiring board 5 at positions more closely toward the center, it will be possible to arrange external terminals 9 at positions more closely toward connecting pads 6a in the central portion of first wiring board 5, which will contribute to further improving the electric characteristics of the semiconductor device. Moreover, by making external terminals 9 even smaller, it will be possible to position lands 7 of first wiring board 5 in a higher density arrangement, which will contribute to further improving the performance of the semiconductor device.

Furthermore, in semiconductor device 1, since wires 12 are short, wires 12 will hardly come into contact with one another and they will have less chance of contacting the end portions of semiconductor chips 3 and 10. Therefore, semiconductor device 1 will be able to achieve high reliability. Moreover, since wires 12 hardly come into contact with the end portions of semiconductor chips 3 and 10, it is possible to arrange connecting pads 6b, at the end portions of first wiring board 5, more closely toward the end portions of semiconductor chips 3 and 10. Therefore, in semiconductor device 1, first wiring board 5 can be miniaturized by the same amount that connecting pads 6b are made closer to the end portions of semiconductor chips 3 and 10.

In addition, in semiconductor device 1, since small solder balls of about 0.35 mm in diameter are used as external terminals 9, the junction areas of external terminals 9 with respect to lands 7 are small. Moreover, since external terminals 9 are arranged in such a way that they are gathered in the central region of the under surface of first wiring board 5, the area of the regions where external terminals 9 are arranged is small. Therefore, in semiconductor device 1, there is less chance of external terminals 9 coming off from first wiring board 5 due to the influence of possible warpage of first wiring board 5 that can be caused by the difference in the thermal expansion coefficient between first semiconductor chip 3 and first wiring board 5. Thus, semiconductor device 1 can achieve high reliability.

Furthermore, in semiconductor device 1, second wiring board 11 having better adhesiveness with the resin material that forms sealing portion 13 than second semiconductor chip 10 is provided on second semiconductor chip 10. Moreover, since second wiring board 11 is formed with the same material and the same thickness as first wiring board 5, there will be less chance of a difference in the amount of thermal expansion, occurring between both wiring boards. Therefore, there will be less change of warpage being generated in semiconductor device 1. Thus, semiconductor device 1 is able to achieve high reliability.

In addition, since external terminals 9 are arranged in such a way that they are gathered in the central region of the under surface of first wiring board 5, semiconductor device 1 will be able to have a broad range of free space where external terminals 9 are not arranged. Therefore, it is possible to use the free space for attaching parts such as chip condensers, etc. at the time of secondary mounting of semiconductor device 1. Thereby, it will be possible to miniaturize an apparatus, etc. that incorporates semiconductor device 1.

Next, a method of manufacturing semiconductor device 1 will be described with reference to FIGS. 4A to 6E.

To begin with, the manufacturing processes of an upper portion of semiconductor device 1 up from second semiconductor chip 10 will be described referring to FIGS. 4A to 4D.

FIGS. 4A to 4D are sectional side views of the upper portion of the semiconductor device in the manufacturing processes thereof. As shown in FIG. 2, second wiring board 11 is provided with connecting pads 6c and 6d, and a predetermined circuit.

Figure 4A:
FIG. 4A is a sectional side view of an upper portion of the semiconductor device shown in FIG. 1 in a manufacturing process thereof.
Figure 4B:
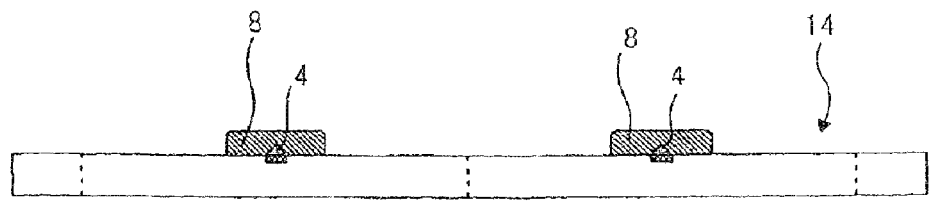
FIG. 4B is a sectional side view of the upper portion of the semiconductor device shown in FIG. 1 in the manufacturing process thereof.

As shown in FIG. 4A, bump electrodes 4 are to be formed on electrode pads 2, which are provided on semiconductor wafer 14, by wire bumping. Then, as shown in FIG. 4B, by masking the portions other than the vicinities of bump electrodes 4, and coating semiconductor wafer 14 with underfill material 8, underfill materials 8 are to be formed selectively in the vicinities of bump electrodes 4. Then, as shown in FIG. 4C, second wiring boards 11 are to be mounted on semiconductor wafer 14 by letting second wiring boards 11 press underfill materials 8 in a way so that underfill materials 8 are flattened out such that second wiring boards 11 are flip-chip bonded to semiconductor wafer 14.

Figure 4C:
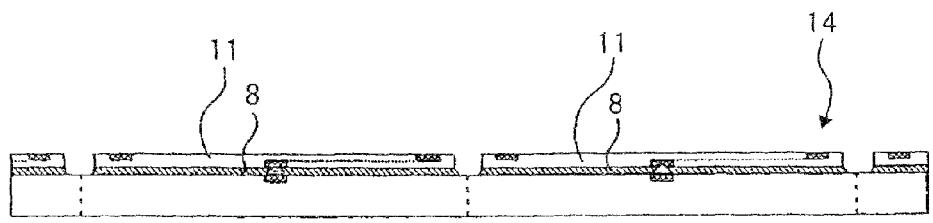
FIG. 4C is a sectional side view of the upper portion of the semiconductor device shown in FIG. 1 in the manufacturing process thereof.

In the state shown in FIG. 4C, bump electrodes 4 and connecting pads 6d of second wiring boards 11 are electrically connected while underfill materials 8 are stretched and expanded in between semiconductor wafer 14 and second wiring boards 11, respectively. As shown in FIG. 2, since openings 15 are formed in second wiring board 11, it is possible to prevent voids from being generated inside underfill material 8 when it expands.

Figure 4D:
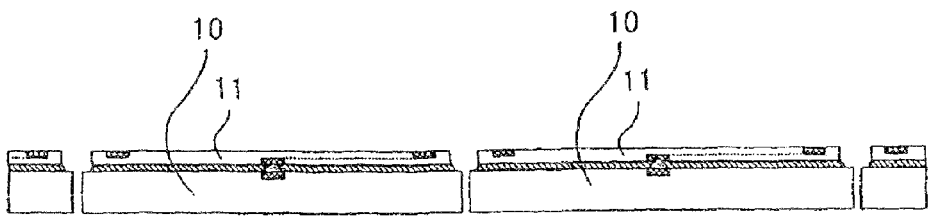
FIG. 4D is a sectional side view of the upper portion of the semiconductor device shown in FIG. 1 in the manufacturing process thereof.

Then, as shown in FIG. 4D, semiconductor wafer 14 will be diced to be separated into individual pieces. Since semiconductor device 1 can be obtained through wafer-level manufacturing, high manufacturing efficiency with low manufacturing costs can be achieved. Second wiring board 11 is formed as being smaller than second semiconductor chip 10, and it is arranged such that it will fit inside a position 50 μm inward from the cut surfaces which are to be made by dicing second semiconductor chip 10. Thereby, it will be possible to prevent a dicing blade from touching second wiring board 11 at the time of dicing second semiconductor chip 10. Therefore, with semiconductor device 1, the manufacturing yield can be rendered high.

Next, the manufacturing processes of a lower portion of semiconductor device 1 down from first semiconductor chip 3 will be described referring to FIGS. 5A to 5C.

Figure 5A:
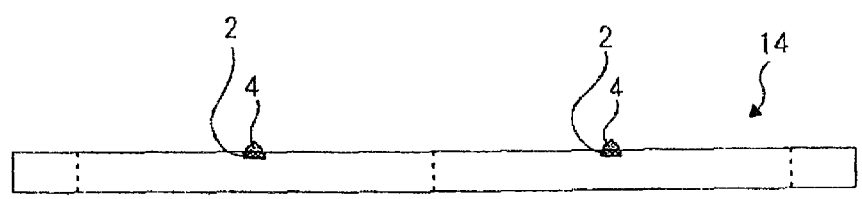
FIG. 5A is a sectional side view of a lower portion of the semiconductor device shown in FIG. 1 in the manufacturing process thereof.
Figure 5B:
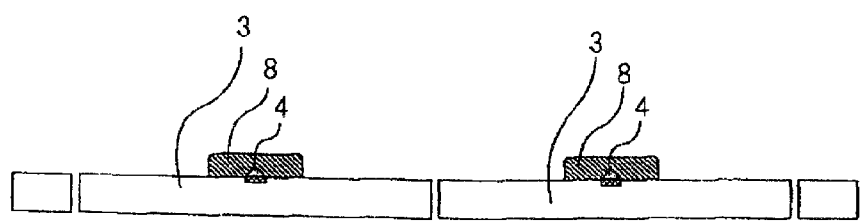
FIG. 5B is a sectional side view of the lower portion of the semiconductor device shown in FIG. 1 in the manufacturing process thereof.
Figure 5C:
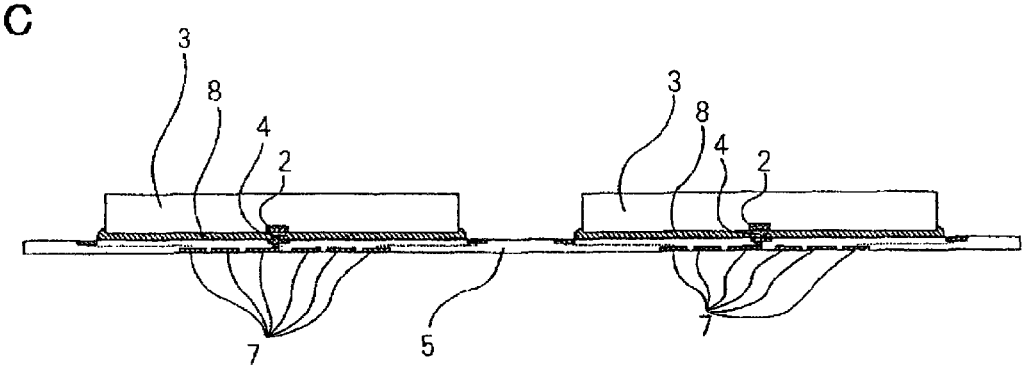
FIG. 5C is a sectional side view of the lower portion of the semiconductor device shown in FIG. 1 in the manufacturing process thereof.

FIGS. 5A to 5C are sectional side views of the lower portion of the semiconductor device in the manufacturing processes thereof. As with the case of second wiring board 11, first wiring board 5 is provided with connecting pads 6a and 6b, and a predetermined circuit.

As shown in FIG. 5A, bump electrodes 4 are to be formed on electrode pads 2, which are provided on semiconductor wafer 14, by wire bumping. Then, as shown in FIG. 5B, by masking the portions other than the vicinities of bump electrodes 4 (the vicinities of connecting pads 6a in the central portions of first wiring boards 5), and coating semiconductor wafer 14 with underfill material 8, underfill materials 8 are to be formed selectively in the vicinities of bump electrodes 4 (in the vicinities of connecting pads 6a in the central portions of first wiring boards 5). After that, semiconductor wafer 14 will be diced to be separated into individual pieces. Then, as shown in FIG. 5C, first semiconductor chips 3 are to be mounted on first wiring board 5 by letting first semiconductor chips 3 press underfill materials 8 in a way so that underfill materials are flattened out such that first semiconductor chips 3 are flip-chip bonded to first wiring board 5.

In the state shown in FIG. 5C, bump electrodes 4 of first semiconductor chips 3 and connecting pads 6a of first wiring board 5 are electrically connected while underfill materials 8 are stretched and expanded in between first wiring board 5 and first semiconductor chips 3, respectively.

Next, processes up to completion of manufacturing semiconductor device 1, including a process of bonding first semiconductor chip 3 and second semiconductor chip 10 of semiconductor device 1, will be described with reference to FIGS. 6A to 6E.

FIGS. 6A to 6E are sectional side views of the semiconductor device in the manufacturing processes thereof.

Figure 6A:
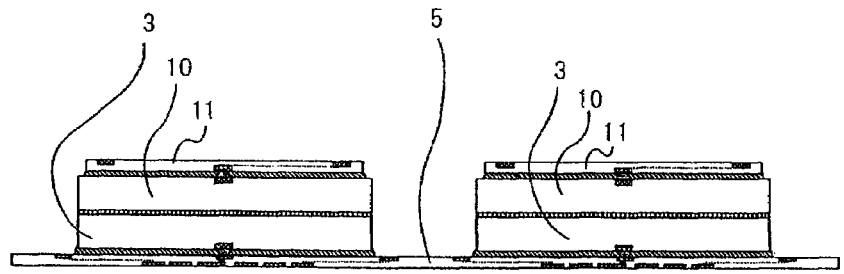
FIG. 6A is a sectional side view of the semiconductor device shown in FIG. 1 in the manufacturing process thereof.

As shown in FIG. 6A, second semiconductor chips 10 are to be attached to first semiconductor chips 3 through DAFs, respectively. Thereby, the upper portions of semiconductor devices 1 will be attached to the lower portions of the same.

Figure 6B:
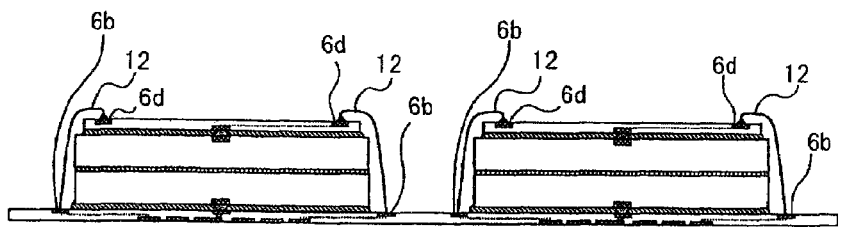
FIG. 6B is a sectional side view of the semiconductor device shown in FIG. 1 in the manufacturing process thereof.
Figure 6C:
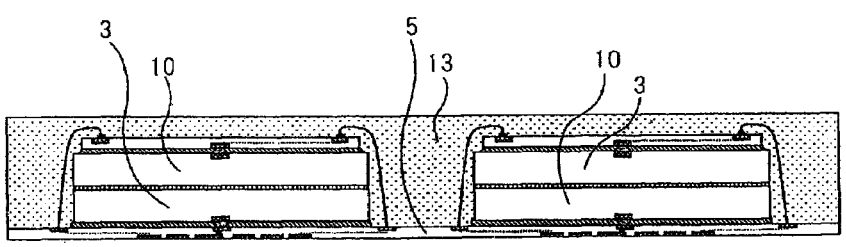
FIG. 6C is a sectional side view of the semiconductor device shown in FIG. 1 in the manufacturing process thereof.
Figure 6D:
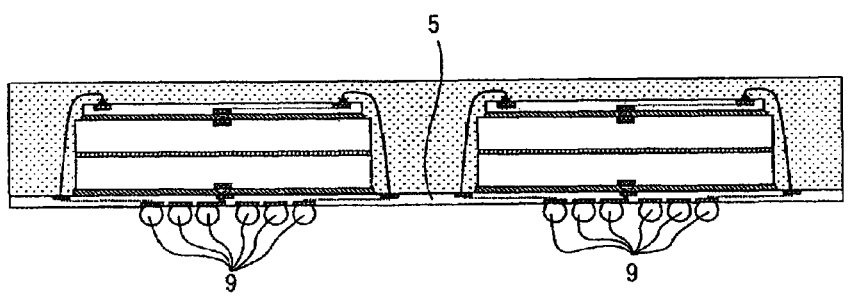
FIG. 6D is a sectional side view of the semiconductor device shown in FIG. 1 in the manufacturing process thereof.
Figure 6E:
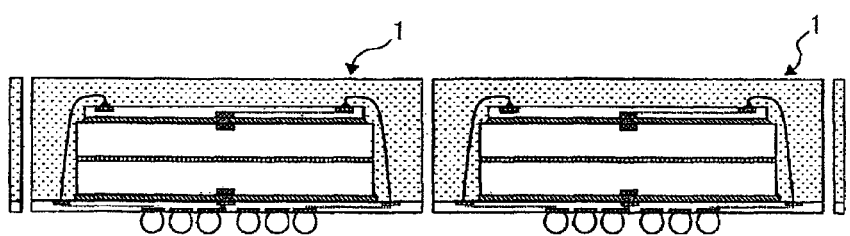
FIG. 6E is a sectional side view of the semiconductor device shown in FIG. 1 in the manufacturing process thereof.

Then, as shown in FIG. 6B, connecting pads 6b of first wiring board 5 and connecting pads 6d of second wiring boards 11 will be electrically connected through wires 12, respectively. After that, as shown in FIG. 6C, sealing portion 13 will be formed on first wiring board 5 in a way so as to cover upper portion of semiconductor devices 1 up from first wiring board 5. Then, as shown in FIG. 6D, external terminals 9 are to be attached to respective lands 7 provided in the under surface of first wiring board 5. After that, as shown in FIG. 6E, first wiring board 5 and sealing portion 13 will be diced to be separated into individual pieces, at which point the manufacturing of semiconductor devices 1 will be completed.

Second Exemplary Embodiment

Figure 7:
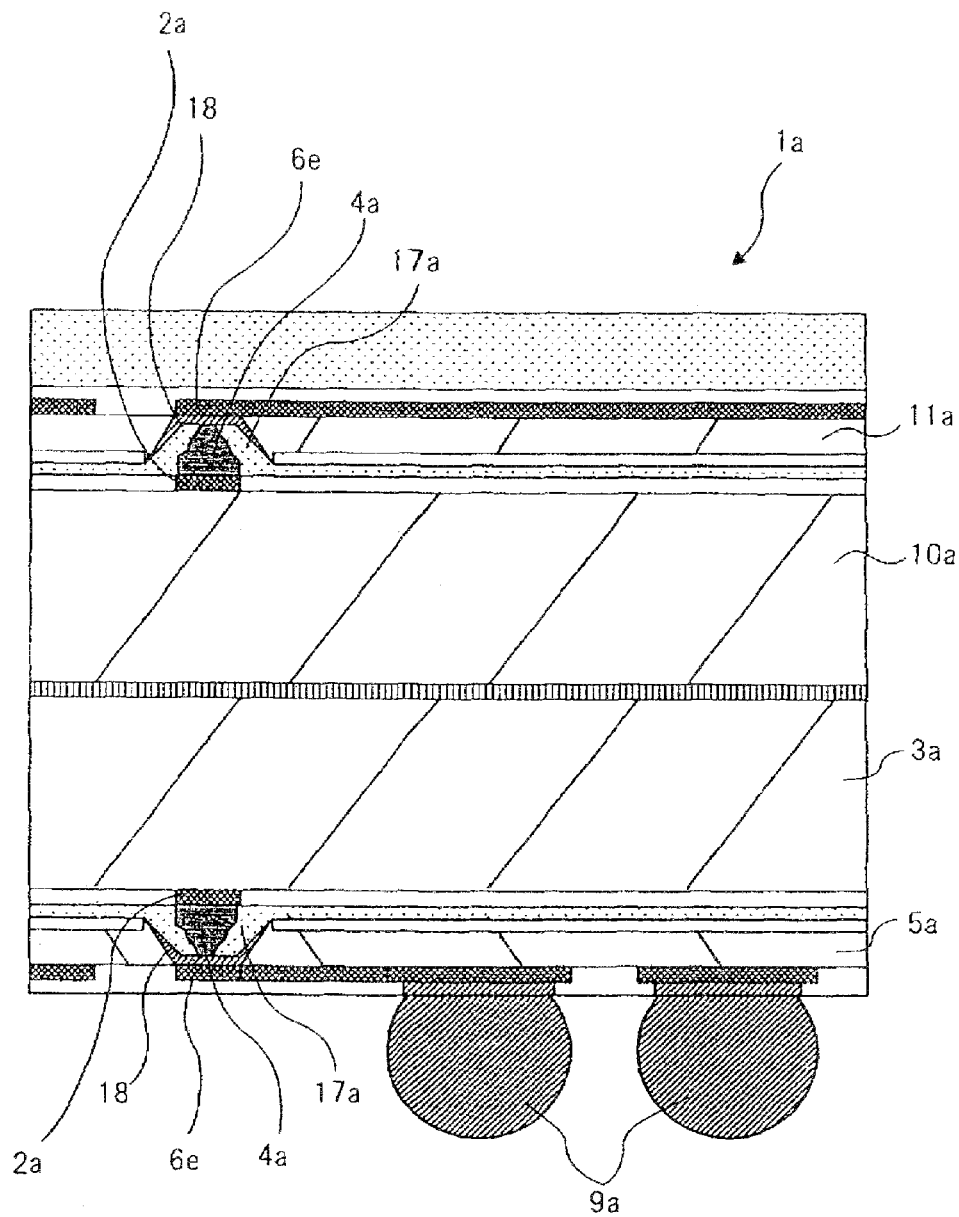
FIG. 7 is an enlarged sectional side view of bump electrodes and their periphery in a semiconductor device according to a second exemplary embodiment.

FIG. 7 is an enlarged sectional side view of bump electrodes and their periphery in a semiconductor device according to a second exemplary embodiment. In semiconductor device 1a according to the present exemplary embodiment, connecting openings 17a are formed on first wiring board 5a and second wiring board 11a, respectively. Bump electrodes 4a of first semiconductor chip 3a and second semiconductor chip 10a are electrically connected with connecting pads 6e, respectively, in a way such that bump electrodes 4a are in states of being entered into connecting openings 17a of first wiring board 5a and second wiring board 11a. With respect to semiconductor device 1a according to the present exemplary embodiment, the structures of the parts other than the bump electrodes and their periphery are the same as the ones in semiconductor device 1 according to the first exemplary embodiment.

In semiconductor device 1a, since bump electrode 4a of first semiconductor chip 3a is connected with connecting pad 6e in a way such that bump electrode 4a is in a state of being entered into connecting opening 17a of first wiring board 5a, electrode pad 2a of first semiconductor chip 3a and the under surface of first wiring board 5a, where external terminals 9a are provided, are electrically connected within an even shorter distance. Therefore, semiconductor device 1a can achieve excellent electric characteristics.

Furthermore, in semiconductor device 1a, plated film 18 is formed inside each connecting opening 17a, by which contact resistance with respect to bump electrode 4a and connecting pad 6e is reduced. Plated film 18, for example, is formed by conducting plate processing on three layers of copper (Cu), nickel (Ni) and gold (Au).

Moreover, semiconductor device 1a is made thinner by the same amount that the bump electrodes 4a are entered inside connecting openings 17a.

Third Exemplary Embodiment

Figure 8:
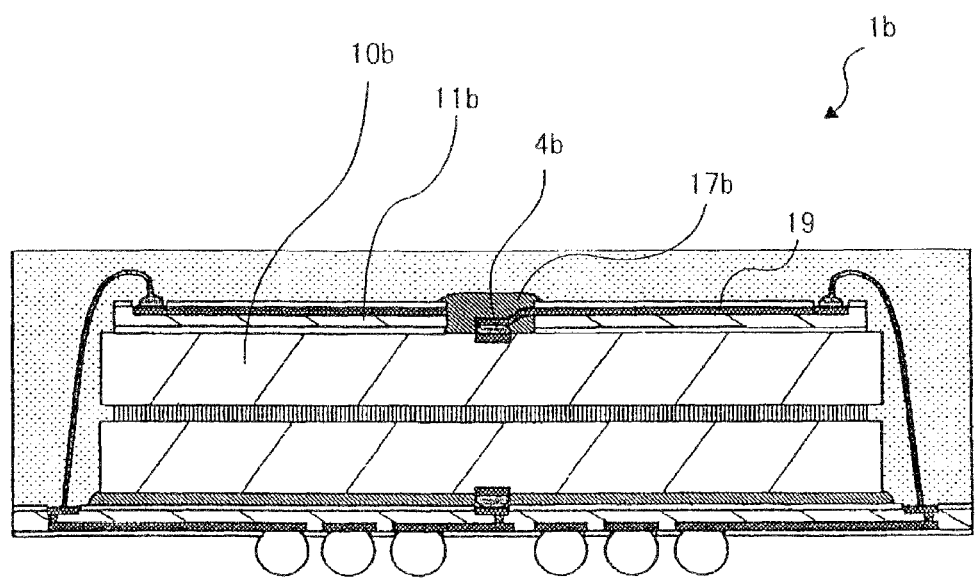
FIG. 8 is a sectional side view of a semiconductor device according to a third exemplary embodiment.

FIG. 8 is a sectional side view of a semiconductor device according to a third exemplary embodiment. In semiconductor device 1b according to the present exemplary embodiment, a film lead, which is used in TCP (tape carrier package), etc, is used for wiring at second wiring board 11b. With respect to semiconductor device 1b according to the present exemplary embodiment, structures of the parts other than the wiring at second wiring board 11b are the same as the ones in semiconductor device 1 according to the first exemplary embodiment.

In semiconductor device 1b, film lead 19 is the inner lead bonded to bump electrode 4b of second semiconductor chip 10b. Such inner lead bonding can be conducted on multiple semiconductor devices in a lump with high precision. With respect to semiconductor device 1b, improvement in mass productivity is achieved by using the film lead that enables inner lead bonding. In second wiring board 11b, connecting opening 17b is formed to facilitate the inner lead bonding. This connecting opening 17b will also function to let a gas, which could be generated as a solvent that evaporates at the time of conducting the inner lead bonding, be discharged outside semiconductor device 1b.

Fourth Exemplary Embodiment

Figure 9:
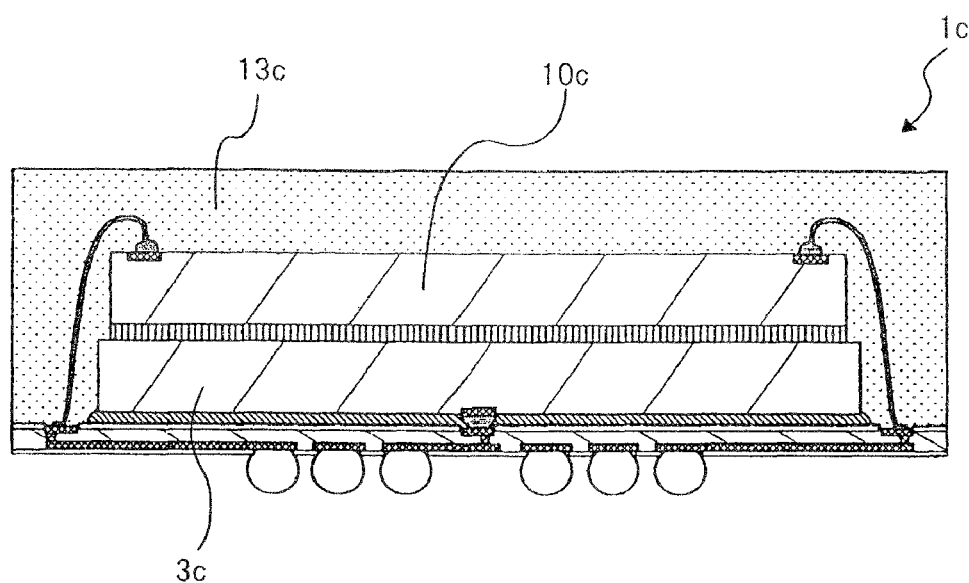
FIG. 9 is a sectional side view of a semiconductor device according to a fourth exemplary embodiment.

FIG. 9 is a sectional side view of a semiconductor device according to a fourth exemplary embodiment. Semiconductor device 1c according to the present exemplary embodiment includes first semiconductor chip 3c and second semiconductor chip 10c. In addition, semiconductor device 1c is not provided with a wiring board in the upper portion thereof. With respect to semiconductor device 1c according to the present exemplary embodiment, structures, except for structures of first semiconductor chip 3c and of second semiconductor chip 10c and a structure of the upper portion not being provided with the wiring board, are the same as the ones in semiconductor device 1 according to the first exemplary embodiment.

In semiconductor device 1c, first semiconductor chip 3c and second semiconductor chip 10c are semiconductor chips of different kinds and sizes. In this way, semiconductor device 1c can achieve improved electric characteristics as in the case of semiconductor device 1 according to the first exemplary embodiment, and moreover, semiconductor device 1c can let different kinds of semiconductor chips function in an integrated manner. Therefore, with semiconductor device 1c, it is possible to realize a highly-functional system-in-package. Furthermore, since it is possible to change sizes of the semiconductor chips variously, various design possibilities are given to the semiconductor device.

In addition, in semiconductor device 1c, adhesiveness of second semiconductor chip 10c with respect to sealing portion 13c is being secured sufficiently. In such case, eliminating the wiring board in the upper portion will contribute to reducing manufacturing costs.

Fifth Exemplary Embodiment

Figure 10:
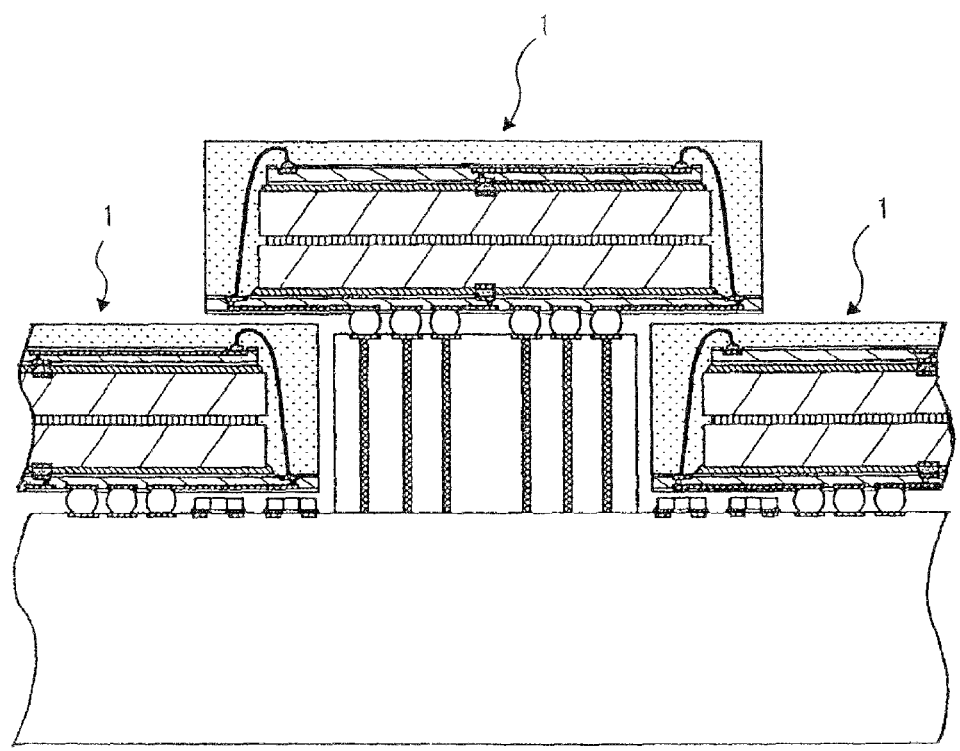
FIG. 10 is a partial sectional side view of a semiconductor module according to a fifth exemplary embodiment.

FIG. 10 is a partial sectional side view of a semiconductor module according to a fifth exemplary embodiment. The semiconductor module according to the present exemplary embodiment has a two-stage configuration including an upper stage and a lower stage, the upper stage and the lower stage including semiconductor devices 1 according to the first exemplary embodiment, respectively. In this semiconductor module, free space at the under surface of semiconductor device 1 in the upper stage is arranged closely to the upper surface of semiconductor device 1 in the lower stage.

Figure 11:
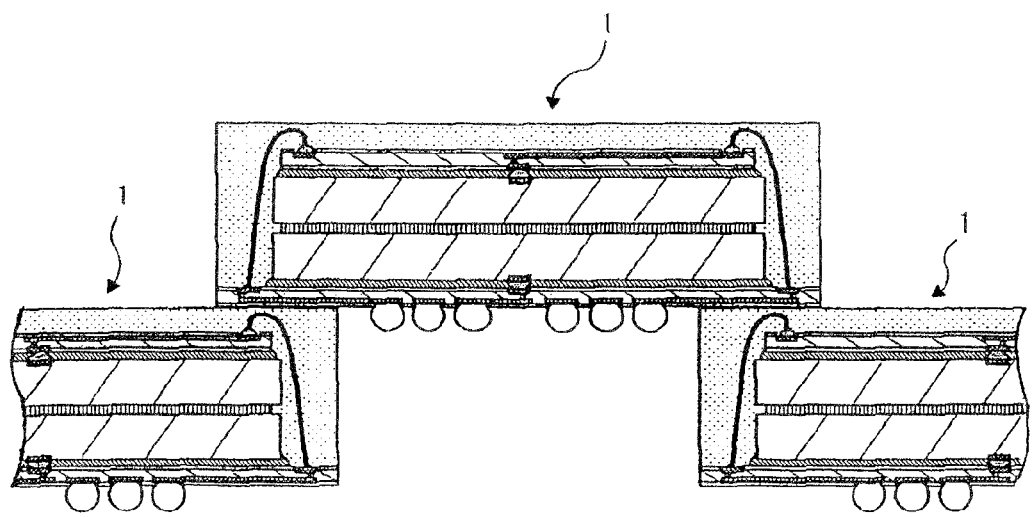
FIG. 11 is a partial sectional side view of the semiconductor module according to the fifth exemplary embodiment.

In this semiconductor module, semiconductor devices 1 are arranged in two stages, whereby semiconductor devices 1 can be arranged in a higher density arrangement than in a case of their being arranged two-dimensionally, and thus miniaturization of the semiconductor module can be achieved. Furthermore, as shown in FIG. 11, it is also possible to load semiconductor devices 1 in such a way that the free space at the under surface of semiconductor device 1 in the upper stage contacts the upper surface of semiconductor device 1 in the lower stage.

Although the semiconductor module according to the present exemplary embodiment is configured into two stages, it is also possible to increase the number of stages depending on the allowable height of the semiconductor module. Thereby, the semiconductor module can achieve high performance with the same packaging area.

As described above, according to the semiconductor module of the present exemplary embodiment, it is possible to provide a semiconductor module, packaged in a high density arrangement, that has excellent electric characteristics, being packaged with high density.

It is apparent that the present invention is not limited to the above embodiments, but may be modified and changed without departing from the scope and spirit of the invention.

What is claimed is:

1. A semiconductor device, comprising:
a first wiring board including a first upper surface, a first lower surface opposite to the first upper surface, a first connection pad formed on a central portion of the first upper surface, and a second connection pad formed on a peripheral portion of the first upper surface;
a first semiconductor chip including a first surface, a second surface opposite to the first surface, and a first electrode pad formed on the first surface, and mounted on the first upper surface of the first wiring board so that the first surface of the first semiconductor chip faces the first wiring board, and the first electrode pad being electrically connected with the first connection pad of the first wiring board;
a second semiconductor chip including a third surface, a fourth surface opposite to the third surface, and a second electrode pad formed on the third surface, and mounted on the second surface of the first semiconductor chip so that the fourth surface of the second semiconductor chip faces the first semiconductor chip;
a second wiring board including a second upper surface, a second lower surface opposite to the second upper surface, a third connection pad formed on a periphery of the second upper surface, and a fourth connection pad formed on the second lower surface, the third connection pad electrically connected to the fourth connection pad, and the second wiring board mounted on the third surface of the second semiconductor chip so that the second lower surface of the second wiring board faces the second semiconductor chip, the second electrode pad being electrically connected with the fourth electrode pad of the second wiring board; and
a conductive wire electrically connected between the second connection pad of the first wiring board and the third connection pad of the second wiring board.

2. The semiconductor device according to claim 1, wherein the first wiring board includes a plurality of external terminals formed on the first lower surface, the first and second connection pads being electrically connected with an associated one of external terminals.

3. The semiconductor device according to claim 2, wherein the external terminals are arranged at the central region of the first wiring board.

4. The semiconductor device according to claim 1, further comprising:
a first bump electrode provided between the first connection pad of the first wiring board and the first electrode pad of the first semiconductor chip; and a second bump electrode provided between the fourth connection pad of the second wiring board and the second electrode pad of the second semiconductor chip.

5. The semiconductor device according to claim 1, wherein the first wiring board and the second wiring board are made of substantially the same material with substantially thickness.

6. The semiconductor device according to claim 1, wherein the second surface of the first semiconductor chip and fourth surface of the second semiconductor chip are attached to each other through a die attached material.

7. The semiconductor device according to claim 1, further comprising:

a first underfill material provided between the first surface of the first semiconductor chip and first upper surface of the first wiring board; and a second underfill material provided between the third surface of the second semiconductor chip and the second lower surface of the second wiring board.

8. The semiconductor device according to claim 1, further comprising:

a sealing portion formed on the first upper surface of the first wiring board, and covering the first semiconductor chip, the second semiconductor chip, the second wiring board, and the conductive wire.

* * * * *